United States Patent
Cazaux et al.

[11] Patent Number: 5,422,503
[45] Date of Patent: Jun. 6, 1995

[54] CCD SHIFT REGISTER WITH IMPROVED READING DEVICE

[75] Inventors: Yvon Cazaux, Grenoble; Jean-Alain Cortiula, Claiy; Jean Marine, Seyssinet, all of France

[73] Assignee: Thomson-CSF Semiconducteurs Specifiques, Paris, France

[21] Appl. No.: 170,763

[22] Filed: Dec. 21, 1993

[30] Foreign Application Priority Data

Dec. 22, 1992 [FR] France ................ 92 15478

[51] Int. Cl.⁶ .............................. H01L 29/78
[52] U.S. Cl. .................... 257/239; 257/240; 257/249
[58] Field of Search ............ 257/239, 240, 249

[56] References Cited

U.S. PATENT DOCUMENTS 4,403,237  9/1983  Ohkubo et al. ............ 257/240
5,173,757  12/1992  Miwada ..................... 257/239

FOREIGN PATENT DOCUMENTS 0456241  11/1991  European Pat. Off. .
0242291  10/1987  France .
58-210674  12/1983  Japan .
60-111467  6/1985  Japan ............... 257/240
60-224264  11/1985  Japan ............... 257/249
61-161756  7/1986  Japan ............... 257/239
61-285767  12/1986  Japan .

*Primary Examiner*—Ngân V. Ngô
*Attorney, Agent, or Firm*—Oblon, Spivak, McClelland, Maier & Neustadt

[57] ABSTRACT

A CCD shift register having a reading device, or charge/voltage conversion device, at one end. This reading device or charge/voltage conversion device includes a diode, a precharging transistor, and an amplifier with high input impedance. To improve the efficiency of the charge transfer and, more generally, the behavior of the register, especially at high frequencies, it is proposed to shape the final gate of the register, and the diode, in such a way that the width along which the gate is adjacent to the diode (i.e. the width along which the end of the channel is adjacent to the diode) is great while, at the same time, the diode surface area is kept small.

7 Claims, 4 Drawing Sheets

CCD SHIFT REGISTER WITH IMPROVED READING DEVICE

BACKGROUND OF THE INVENTION

1. Field of the Invention

The invention relates to charge-transfer or charge-coupled devices (CCDs).

A CCD shift register is constituted by a succession of electrodes juxtaposed above a surface semiconductor zone: the electrodes are generally insulated from this zone by a very thin insulating layer.

The application of appropriate potentials to the electrodes enables the creation, in the semiconductor, of potential wells in which the mobile electrical charges can collect. Appropriate modifications of potentials enable these charges to be shifted from one well into an adjacent well, this being done in synchronism for all the wells of the register, so as to make the charge packets move forward towards the output of the register in synchronism. The charges that collect in the wells are introduced either by an upline end of the register or in parallel in all the wells. These charges represent information elements, for example the luminance of each pixel of an image line in the case of a shift register associated with a photosensitive image sensor.

The packets of electrical charges conveyed by the register may be converted into electrical voltages at the output of the register. These voltages are then processed by analog or logic circuits. To this end, a charge/voltage conversion device, also called a charge-reading device, is placed at the output of the register.

The reading device works in synchronism with the register, so that each packet of charges that reaches the reading device can be converted into an electrical voltage that is transmitted to a downline circuit (usually constituted by a sample-and-hold device), before a new packet of charges reaches the reading device.

2. Description of the Prior Art

The simplest reading device, shown in symbolic form in FIG. 1, is constituted by:

- a capacitor C having an electrode with fixed potential (electrical ground for example) and an electrode with variable potential,
- a transistor T for the periodic precharging of the capacitor at another fixed potential (Vdr),
- and an amplifier A, at high input impedance, connected to the capacitor, to detect the potential at the terminals of this capacitor.

The output voltage Vs of the amplifier represents the output signal of the reading device, proportional to the quantity of charges contained in the packet read.

Before the beginning of a reading operation, the transistor T is made conductive so that the electrode with variable potential, which is connected to the transistor, the precharging fixed potential Vdr. The precharging potential Vdr is positive in the usual case where the charges conveyed are negative (electrons).

Then, the transistor T is turned off and a packet of charges is shifted, by means of the last electrode of the register R, to the electrode with variable potential of the capacitor. The potential of this electrode, which is initially at Vdr, drops by a value V1 that is proportional to the quantity of charges of the packet. The voltage $Vs = G(Vdr - V1)$, which appears at the output S of the amplifier A with a gain G, is a linear function of the voltage drop V1. This voltage drop V1 is itself equal to the ratio of the quantity of charges Q shifted to the capacitor C to the value of this capacitor C.

$$V1 = Q/C$$

The reading device then has what is known as a conversion factor Ks, equal to qG/C, where q is the charge of an electron; this conversion factor represents the value of the voltage increment appearing at the output S of the device (i.e. at the output of the amplifier A) when a charge increment (an electron) is shifted to the capacitor C.

If small quantities of charges are to be read, for example the charges resulting from a low illumination of a photodiode, it is useful for the conversion factor Ks to be high. This result can be obtained with a sufficiently high gain G and a low-value capacitor C.

However, the technological imperatives of CCDs dictate that, in practice, the amplifier A is formed with insulated-gate field-effect transistors (MOS transistors). These amplifiers have substantial noise at the input, and this noise is amplified with the gain G. It is therefore desirable not to have an excessive gain. In practice, even follower amplifiers with a gain of less than 1 are used. It is then the value of the capacitor C that must be substantially reduced to have a substantial conversion factor Ks.

The device most frequently used to form this capacitor is a reverse-biased PN junction diode. The grounded electrode is the substrate (in principle a P type substrate) of the semiconductor in which the CCD register is formed, and the other electrode of the diode is constituted by an N+ type diffused on the surface in the substrate and placed immediately beside the last electrode of the register, so that a packet of charges flowing in the register can be shifted directly into the N+ diffused zone.

FIG. 2 shows a top view (FIG. 2a) and a longitudinal section (FIG. 2b) of the principle of the construction of a reading device such as this at the output of a register. The register R comprises an alternation of storage electrodes Es and transfer electrodes Et. The last storage electrode is generally followed by an output electrode Gs with fixed potential, which itself is followed by the reading diode D (N+ diffusion) and is immediately adjacent to this diode. The N+ transistor constitutes, at the same time, the source of the precharging transistor and it is therefore separated from another N+ diffusion (D'), constituting the drain of this transistor, by an insulated control gate Gc. The drain D' is connected to a voltage source Vdr. The N+ diffusion of the diode D is connected by a surface electrical contact to the input of the amplifier A. The amplifier is shown in a symbolic form in FIG. 2.

In FIG. 2, heavy dashes have been used to show the lateral limits of the channel CH in which there flow the charges beneath the electrodes. This channel is defined by the semiconductor zone, with the electrodes of the register overhanging this semiconductor zone, and is separated from these electrodes by a very thin insulator layer; the channel CH may be demarcated laterally by the thick silicon oxide on which there rises the lateral edges of the electrodes. The N+ diffusion of the diode D is in the prolongation of this channel and is itself surrounded by thick oxide, just like the drain D'. The section of FIG. 2b is taken along the axis of the channel CH and therefore does not allow the thick silicon oxide surrounding the channel to be seen. However, a zone of thick oxide has been shown beyond the drain D' of the transistor.

In the case of FIG. 2, the reading diode D is adjacent to the entire width of the electrodes of the register (a width of 20 to 100 micrometers for example). It is therefore hardly possibly to consider it as having a small surface area, and the conversion factor of the reading device is fairly small).

This is why a device has already been proposed in the prior art (see for example EP 0242 291), of the type shown in FIG. 3, wherein the diode actually has a small surface area (for example 5 micrometers by 5 micrometers); the channel CH in which the charges flow gradually narrows towards this diode.

To improve the transfer in making the paths of the charges uniform, the electrodes are in the form of ring sectors in the vicinity of the diode.

A compromise has thus been obtained between the need for a sufficient width of the register (to convey substantial quantities of charge, corresponding for example to an intense illumination of a photodiode) and a small-sized reading diode (to enable the reading of the small quantities of charges with an appropriate signal-to-noise ratio).

It is noted that, in the device of FIG. 3, the storage electrodes Es have, in principle, a length L (in the longitudinal direction, i.e. in the direction of transfer of the charges) that gradually increases in order to keep a storage surface area more or less constant despite the gradual reduction of the width of the channel.

Reasons for which an explanation shall be attempted below have led to the observation that the structure of FIG. 3 has drawbacks, precisely due to the narrowing of the channel. The present invention is aimed at reducing these drawbacks while, at the same time, keeping the advantage of a small reading capacity (this is the advantage of a high conversion factor without excessive deterioration of the signal-to-noise ratio in the small-amplitude signals).

To attain this goal, the invention proposes to obtain a result where the width of the last gate of the register, adjacent to a small-sized reading diode, is appreciably greater (with respect to the surface area of the reading diode) than in the prior art. The word "width" is taken here, and in the rest of this document, to be a dimensional measurement along a line that is substantially perpendicular to the path of the electrical charges.

SUMMARY OF THE INVENTION

According to a first embodiment, the invention proposes a CCD shift register formed in a semiconductor substrate, said shift register comprising an output gate forming the last electrode of the shift register, adjacent to a diffused semiconductor zone forming a capacitive junction with the substrate, wherein the output gate is adjacent to the diffused zone with a width that is at least 40%, and preferably more than 50%, of the perimeter of the diffused zone.

In other words, in the prior art, the last gate is adjacent to the reading diode, generally along more than 25 to 30% of the perimeter of the diode (in any case for reading diodes that are small in relation to the surfaces of the storage electrodes of the register, i.e. generally when the charge-transfer channel of the register narrows towards a diode that is smaller than the main width of the channel). Here, it is proposed that the output gate should, if possible, surround half of the perimeter of the diode, the best solution being that it should do so as much as possible.

According to another embodiment, the invention proposes a shift register formed in a semiconductor substrate and comprising a reading device at one end of the register, the reading device comprising an output gate forming a final electrode of the shift register, adjacent to a semiconductor zone diffused in the substrate and forming a capacitive junction with the substrate; the diffused zone comprising a main surface and a narrow extension projecting from the main surface to the output gate, this extension being entirely surrounded by the output gate.

A narrow extension is understood to be one with a width that is smaller than the dimensions of the main surface. The effect of this extension is that it increases the length of the gate adjacent to the diode at the end of the channel.

The length of this extension may be on the same order as the lateral dimensions of the main surface of the diffused zone, and preferably it is even greater. The width is preferably at least two to three times smaller than the lateral dimensions of the main surface.

The main surface may or may not be surrounded by the output gate.

It will be understood that the invention more generally proposes to configure the diffused zone and the output gate that surrounds it in such a way that the width on which the gate is adjacent to the diode in the channel for the flow of charges (i.e. again the width on which the end of the channel is adjacent to the diode) is great while, at the same time, the diode surface area is kept small.

This can be expressed according to another embodiment of the invention by stating that the output gate is adjacent to the diffused zone, inside a channel for the flow of charges, on a width that is at least twice, and preferably 2.5 times, the square root of the surface area of the diffused zone.

These different formulations of the invention express the following common idea: despite the narrowing of the width of the channel towards a diode with a small surface area, it is necessary to keep a channel width or last-gate width that is large enough for an efficient transfer of the charges from the register towards the diode.

The invention can notably improve the behavior of the register at high frequency for the prior art registers have the drawback, in certain cases, of an inefficient transfer of charges to the output when the shifting frequency of the reader increases. The invention also makes it possible to obtain a better compromise among the requirements of efficient operation at high frequency, high efficiency of charge transfer towards the reading device and a low residual signal for zero charge transfer (the dark signal in the case of CCD imaging devices, a signal present at the output of the reading device, even for a transfer of a zero quantity of charges, corresponding to a black pixel).

The invention can be applied when several shift registers reach one and the same reading diode, with the reading device working either at the same frequency as the registers to add up the charges coming from the different registers in the diode or at a frequency that is a multiple of the frequency of the registers to multiplex the signals coming from the different registers in the reading device. In both cases, the output gate of the register, which is adjacent to the reading diode, may be common to both registers and it is the total width of the two parts of this gate that is considered to be the "width of the last gate". In fact, the shifting of the charges from each channel into the diode will be done on only half this width. It is therefore especially important, in this case, for the perimeter of shifting of the charges into the diode to be as great as possible. This is what makes it more important, in this particular case, to use the gate and diode shapes and dimensions stipulated by the invention.

BRIEF DESCRIPTION OF THE DRAWINGS

Other features and advantages of the invention shall appear from the following detailed description, made with reference to the appended drawings, of which.

DETAILED DESCRIPTION OF THE PREFERRED EMBODIMENTS

Figure 1:
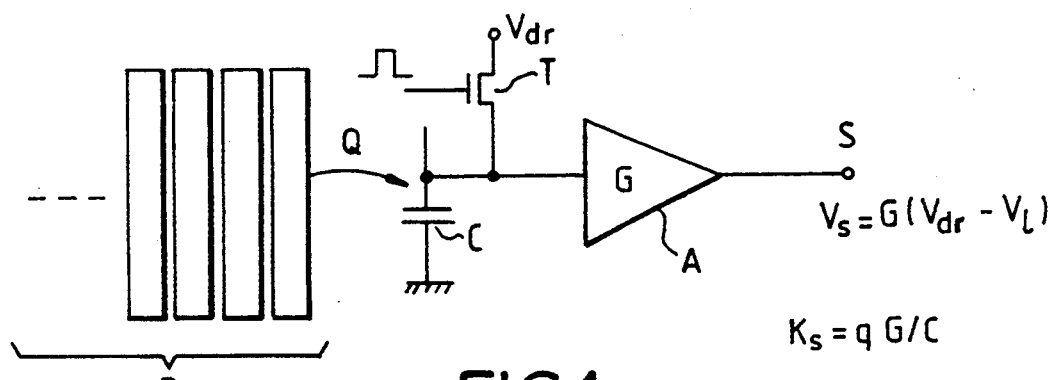
FIGS. 1 to 3, which have already been described, recall the known principles of devices for the reading of charge packets at output of a CCD register.
Figure 2:
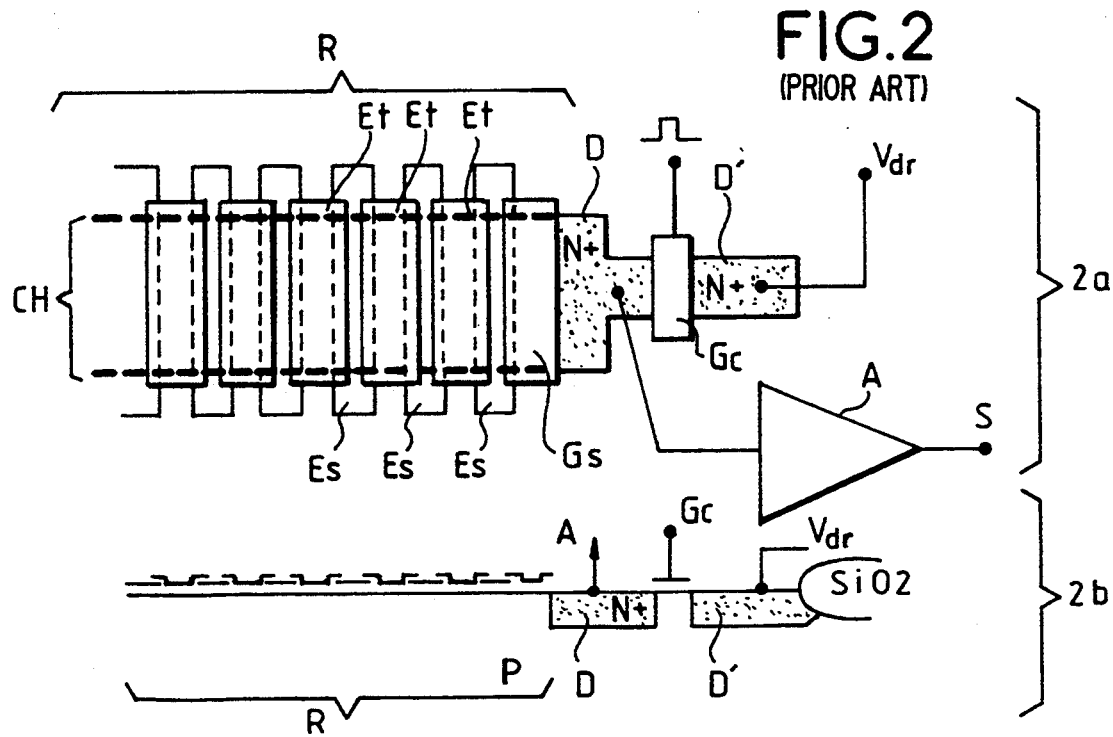
Figure 3:
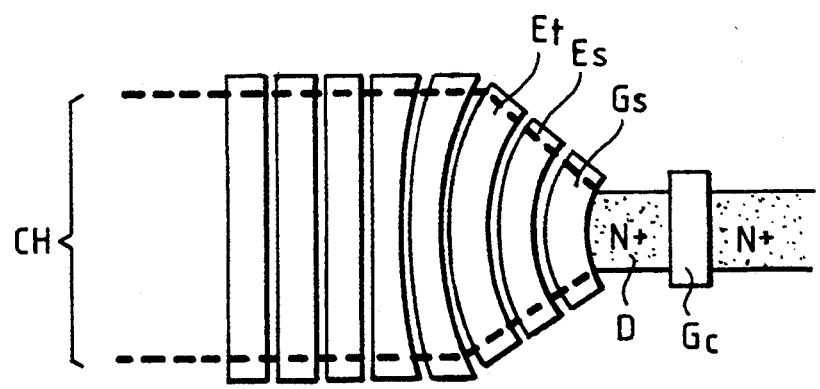
Figure 4:
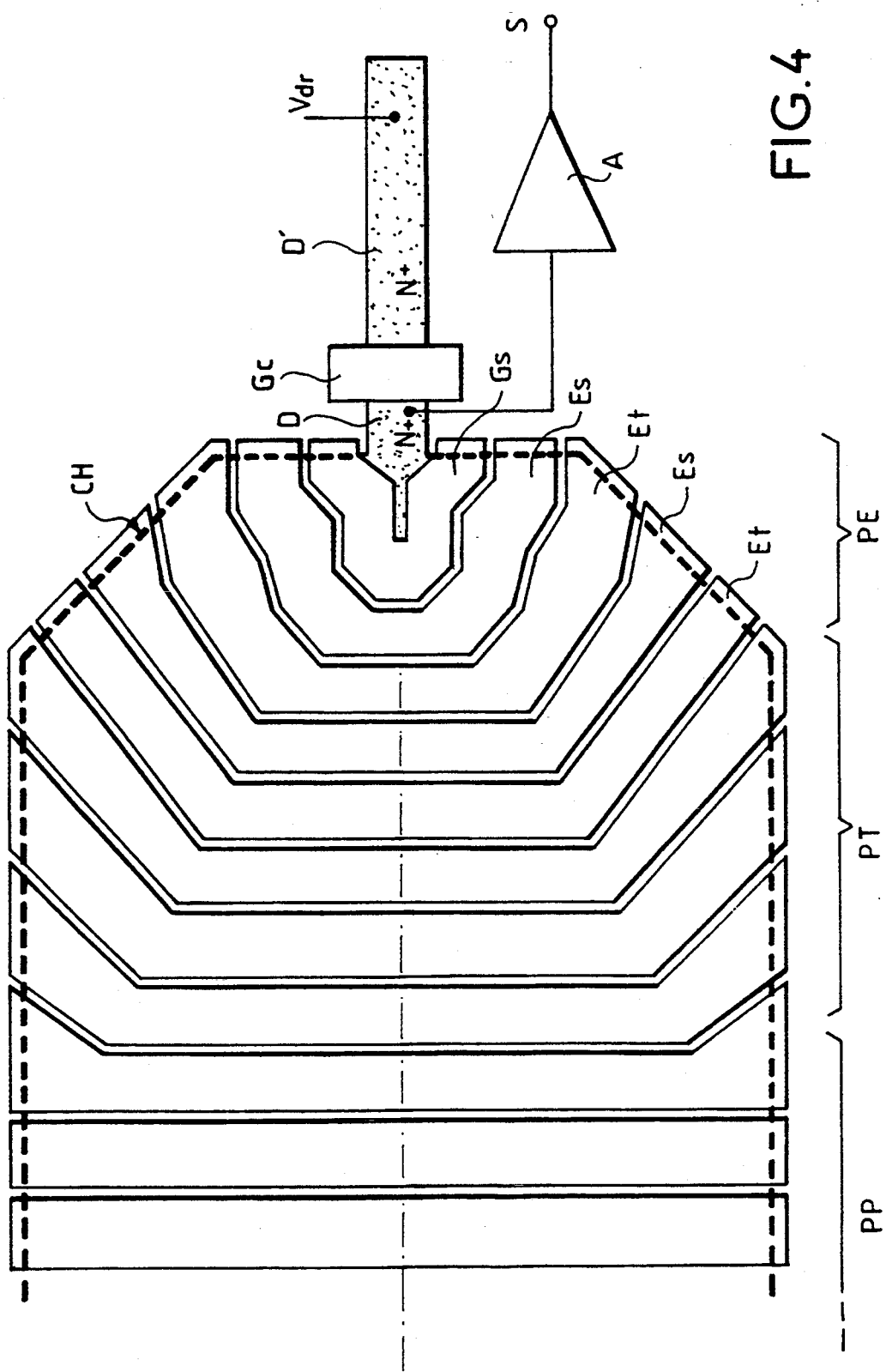
FIG. 4 shows the general structure of the reading device according to the invention.

The reading device of FIG. 4, placed at one end of a CCD shift register, may be considered to comprise, firstly, at least the last electrode of the register and, secondly, the capacitive reading diode into which the charges are shifted, as well as the associated circuits (the precharging transistor T of the capacitive diode and the amplifier A). The last electrode Gs will generally be an electrode carried to a fixed potential unlike the other electrodes of the register, the potentials of which are alternately high and low to ensure the transfer of the charges. The reading diode has a small surface area, i.e. a surface area far smaller than that of the storage electrodes Es.

FIG. 4 shows the feature that gives the invention its specific character, namely the particular shape of the N+ diffused zone constituting the reading diode D, and the shape of the last gate Gs of the shift register, adjacent to the diode D. The shape of the other gates, preceding the gate Gs, is deduced from the gate Gs owing to the fact that it is desired to pass gradually from the elongated rectangular shape of the major part of the electrodes of the shift register to the special shape of the gate Gs which is a flared U shape with arms that are very close to each other at the bottom of the U.

The N+ type diffused zone D has a massive main surface (it is, for example, fairly square-shaped and therefore has transversal dimensions of the same magnitude in every direction), and a narrow extension directed from this main surface to the output gate Gs. In practice, the narrow extension projects into the longitudinal axis of symmetry of the register (the horizontal axis at the center of FIG. 4) for a register with longitudinal axial symmetry.

Preferably, the width of the extension is appreciably smaller (2 to 3 times smaller for example) than the lateral dimensions of the massive part of the semiconductor zone D. The length of the extension from the massive part may be of the same magnitude as these lateral dimensions.

For example, the lateral dimensions of the massive part are about 5×5 micrometers. The extension may have a width of 1 to 2 micrometers and a length of 5 $\mu$m in its projection towards the gate Gs. In the example shown, the extension is connected to the massive main surface by a flared part that facilitates the diffusion, in the diode, of the charges that are shed by the register into the extension.

It is recalled that the main idea of the invention is to increase the reading diode perimeter portion that is immediately adjacent to the last output gate, i.e. the length of channel CH adjacent to the diode, without appreciably increasing the total surface area of the diffused zone. It is therefore this shape with a narrow extension that was chosen, but other shapes could be envisaged provided that they yield a sufficient increase in the ratio of the portion of diode perimeter adjacent to the gate Gs to the square root of the surface area of the diode. A ratio of at least 2 to 2.5 and preferably even more is proposed according to the invention, as in the example shown in FIG. 4.

The portion of narrow extension of the diode D is in any case completely surrounded by the gate Gs. The massive surface portion may be surrounded to varying degrees by the gate Gs or, more exceptionally, it may not be surrounded at all.

Towards its end located on the side of the reading device, the charge-transfer channel CH preferably has a shape that keeps getting narrower and then gets truncated at its end on a width far greater than the width of the diode, and this is what gives the few end diodes a shape of a U whose arms end substantially along a line perpendicular to a longitudinal axis of symmetry of the channel.

The end of the channel could be rounded towards the diode. In the figure, the edges of the channel CH meet the edges of the diffused zone D along a line perpendicular to the general axis of symmetry of the channel.

It is recalled that the channel CH (defined by the heavy dashes in FIG. 4) is defined by the zones covered with a thin insulator, under the electrodes of the register, as opposed to the zones covered with a thick insulator that surround the channel, the diffused zone D and the precharging transistor (D, Gc, D').

The shape of the last gate Gs, which is substantially the shape of a U with its arms very close to each other around the narrow extension of the diode, changes, for the other electrodes of the register, into a U that gets increasingly open with distance from from the last gate.

FIG. 4, for convenience's sake, shows adjacent electrodes separated by a narrow interval but, in fact, the adjacent gates overlap slightly.

The precharging transistor is constituted, in a standard way, for example by a simple control gate Gc, at a distance of some micrometers from the ends of the electrodes of the register. This gate separates the N+ diffused zone D from a diffused zone D', which is also an N+ type zone, constituting the drain of the register.

The drain is connected to the precharging voltage source Vdr. The diode D is connected, by a surface contact, to an amplifier A with high input impedance. The output of the amplifier periodically gives a voltage representing a packet of charges shifted from the register into the diffused zone D.

As can be seen in FIG. 4, the electrodes of the register have an elongated rectangular shape in the main part (zone PP) of the register and a U shape at the end (zone PE) of the register. In an intermediate transition zone (zone PT), they therefore have a shape that varies gradually with the following constraints:

the electrodes must, if possible, be transversal to the direction of the charge transfer. At the center of the device, the direction of transfer is the longitudinal axis of the device but, at the edges, the direction of transfer follows the oblique edges of the channel. At the end, where the channel is truncated perpendicularly to the general longitudinal axis, the transfer in certain zones of the channel is even almost perpendicular to the longitudinal axis of the register;

the electrodes should not have exaggerated long zones (the length is taken in the direction of the charge transfer) on the edges with respect to the length at the center of the device. An excessively great length reduces the efficiency of the transfer of charges;

the surface area of the storage electrodes should be more or less constant from one end of the register to the other, including in the zones PT and PE, so that the ability to store large packets of charges is not reduced at certain places on the register because of an excessively small electrode surface area. The output gate is not affected by this requirement for it is not a storage electrode.

These constraints explain the successive electrode shapes such as, for example, those seen in FIG. 4.

Figure 5:
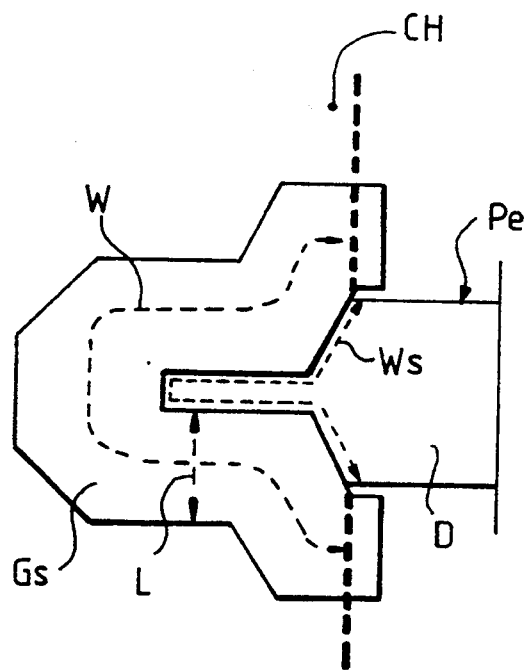
FIG. 5 shows an enlarged view of the last gate of the register and of the diode.

FIG. 5 again shows the unit formed by the last gate Gs of the register and the diode D. The boundary of the channel CH (shown in heavy dashes) is perpendicular to the general longitudinal axis of symmetry. There are three lines of light dashes representing respectively:

the mean length L (in the direction of transfer of the charge packets from a storage electrode Es to the diode D);

the mean width W of the electrode (along a line of dashes that is substantially transversal, at its various points, to the paths of the charge packets);

the width Ws on which the last gate Gs is adjacent to the diode D, or again on which the channel CH is adjacent to the diode D.

The perimeter of the diode D is constituted partly by this width Ws and partly by the length of closed line designated by Pe in the figure. The surface of the diode is constituted by the surface inside this perimeter.

The fact that the output gate Gs is adjacent to the diode on a major part of the perimeter of the diode, or again the fact that the diode is shaped with a narrow extension towards the gate Gs, causes the ratio W/L to be far greater than in the techniques used in the prior art with registers with very small diodes.

This increase in the ratio W/L has the following consequences:

the efficiency of charge transfer towards the diode is greater, especially for the high working frequencies, because the transfer current is substantially proportional to W/L;

it is therefore not necessary to make an exaggerated reduction of the length L in order to keep a sufficient W/L ratio. Consequently, the gate Gs is prevented from being too short (L small), which would prompt a coupling between the last storage electrode and the reading diode. This coupling is expressed by a reading error and the higher the resistivity of the silicon substrate, the greater is the reading error;

since the electrodes of the transition zone PT approach the U shape of the output gate, they can also all have a sufficient ratio W/L without exaggeratedly increasing their length L; it is recalled that the storage electrodes must have a substantially constant surface area from one end of the register to the other;

finally, a phenomenon observed in the registers with a highly narrowed channel has been avoided: when the last gate has a width that narrows (i.e. when it is appreciably narrower at the output of a gate than at the input) and when the width Ws at the output is very small (for example smaller than 10 micrometers in the Applicant's usual technology), a decrease in potential is observed beneath the gate, between the input and output of the gate, leading to an undesirable retention of charges beneath the gate. The shape of the output gate according to the invention circumvents this problem for it keeps a gate with a width Ws that is sufficient at the output, despite the small surface area of the diode.

The invention can also be applied when the reading device is common to two juxtaposed registers, whether for an addition of packets coming from the two registers or for a multiplexing of charge packets.

Figure 6:
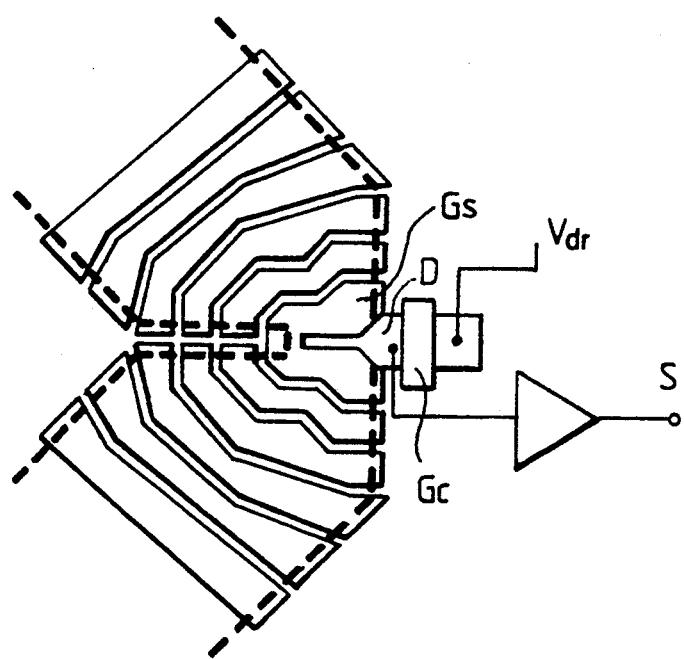
FIG. 6 shows a double register with a common reading device.

FIG. 6 shows this case: the terminal parts of the two registers are juxtaposed, their electrodes being separated (in any case at least as far as the storage electrodes are concerned). The last gate Gs is not necessarily cut into two. Its general shape is similar to that of FIG. 4.

If the registers are actuated simultaneously, the reading diode adds up the charge packets. If they are actuated in phase opposition, the diode acts as a multiplexer of charge packets but, of course, the working frequency of the reading device must then be twice that of the registers so that a precharging of the diode is carried out before each arrival of a charge packet. The channels of the two registers are separate up to the last gate Gs.

Figure 7:
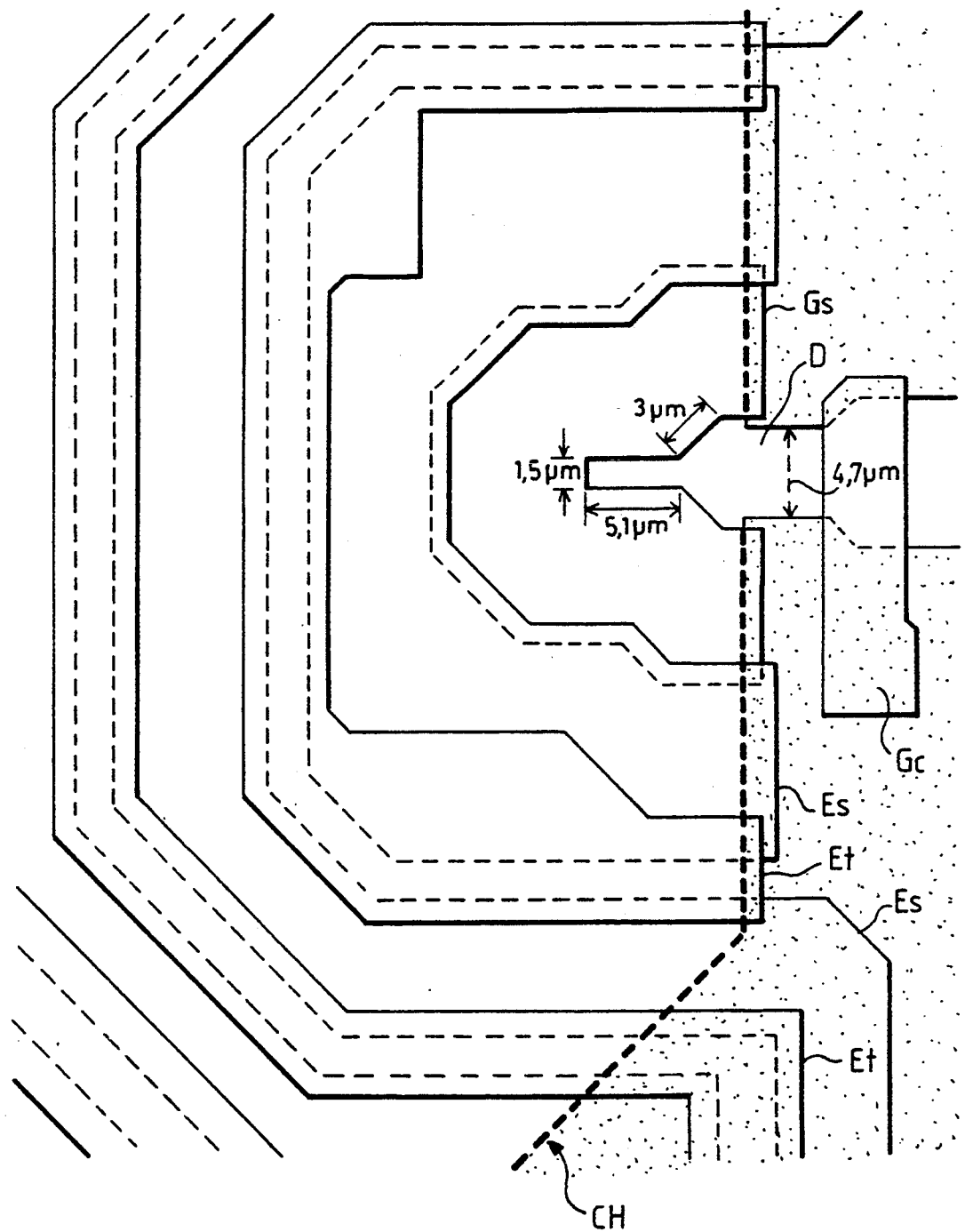
FIG. 7 shows a true-to-scale practical embodiment.

To end this description, FIG. 7 shows a true-to-scale, actual experimental embodiment by the Applicant. The different electrodes are formed by three levels of polycrystalline silicon: a first layer for Gs, a second layer for the storage electrodes Es and a third layer for the transfer electrodes Et. The thick oxide zones are shaded in with dots, even where they are covered with the ends of the different electrodes Et, Es, Gc, Gs. In this practical embodiment, the total perimeter of the diode can be assessed at about 36 micrometers, and the surface area at 45 square micrometers. The perimeter of the diode inside the channel is equal to 20 micrometers (55% of the total perimeter and three times the square root of the surface area). The main surface area of the diode is about 33 square micrometers with lateral dimensions of about 4 to 5 micrometers. The narrow extension projecting towards the gate Gs has a width of about 1.5 micrometers and a length of about 5 micrometers.

What is claimed is:

1. A CCD shift register formed in a semiconductor substrate, comprising:

a channel through which electric charges flow, said channel being formed in said semiconductor substrate and being covered with electrodes, said channel having one end and extending towards said one end in a general direction of propagation of electric charges, and said channel further having a width that progressively narrows towards said one end; and a charge reading device formed at said one end, said charge reading device comprising an output gate which forms a final electrode of said CCD shift register and a semiconductor zone diffused in said semiconductor substrate adjacent to said output gate, said semiconductor zone forming a capacitive junction with said semiconductor substrate, wherein said channel at said one end is terminated by a front edge, said front edge extending perpendicular to said general direction along a distance greater than a width of said semiconductor zone, said width measured perpendicular to said general direction, and said output gate is adjacent to said diffused semiconductor zone along at least 40% of a perimeter of said diffused zone, and wherein said CCD shift register includes further electrodes above a narrowing portion of said channel, said further electrodes surrounding said final electrode.

2. A CCD shift register formed in a semiconductor substrate, comprising:

a charge reading device formed at one end of said CCD register, said charge reading device having an output gate which forms a final electrode of said shift register, said output gate bearing formed adjacent to a semiconductor zone diffused in said semiconductor substrate and forming a capacitive junction with said semiconductor substrate, said diffused zone comprising a main surface and a narrow extension projecting from said main surface towards said output gate so as to be entirely surrounded by said output gate.

3. A CCD register according to claim 2, wherein said narrow extension is of substantially rectangular shape and is elongated in a direction of projection of said extension from said main surface.

4. A CCD shift register according to claim 2, comprising two shift register portions extending towards said charge reading device common to both of said shift register portions, each of said register portions having a respective channel through which electric charges flow, wherein said output gate has a first portion above an end of one of said channels and a second portion above an end of the other channel, said first and second portions of said output gate being respectively adjacent to a respective side of said narrow extension.

5. A CCD shift register formed in a semiconductor substrate, comprising:

a channel through which electric charges flow, said channel being formed in said semiconductor substrate and being covered with electrodes, said channel having one end and extending towards said one end in a general direction of propagation of electric charges, and said channel further having a width that progressively narrows towards said one end; and a charge reading device formed at said one end, said charge reading device comprising an output gate which forms a final electrode of said CCD shift register and a semiconductor zone diffused in said semiconductor substrate adjacent to said output gate, said semiconductor zone forming a capacitive junction with said semiconductor substrate, wherein said channel at said one end is terminated by a front edge, said front edge extending perpendicular to said general direction along a distance greater than a width of said semiconductor zone, said width measured perpendicular to said general direction, and said output gate is adjacent to said diffused semiconductor zone along a perimeter of said diffused zone which is at least twice as great as the square root of a surface area of said diffused zone, and wherein said CCD shift register includes further electrodes above a narrowing portion of said channel, said further electrodes surrounding said final electrode.

6. A CCD shift register according to claim 5, wherein a portion of said output gate located above said channel is adjacent to said diffused zone along a perimeter of said diffused zone that is at least 2.5 times as great as the square root of said surface area of said diffused zone.

7. A CCD shift register formed in a semiconductor substrate, having a final electrode formed adjacent to a reading diode and above an end of a channel through which electric charges flow, wherein said final electrode assumes a flared U-shape having a bottom portion and two arm portions extending from said arm portions, said arm portions being close to one another at a bottom of said U-shape and more spaced from each other at a distance from said bottom portion.

* * * * *